United States Patent [19]

Bernhardt

[11] Patent Number: 5,030,137
[45] Date of Patent: Jul. 9, 1991

[54] FLAT CABLE JUMPER
[75] Inventor: Jerry L. Bernhardt, Vestal, N.Y.
[73] Assignee: Amphenol Interconnect Products Corporation, Endicott, N.Y.
[21] Appl. No.: 472,660
[22] Filed: Jan. 30, 1990
[51] Int. Cl.⁵ .............................................. H01R 9/07
[52] U.S. Cl. ..................................... 439/492; 439/825
[58] Field of Search ............... 439/492, 284, 290, 291, 439/816, 825

[56]  References Cited
U.S. PATENT DOCUMENTS

| | | | |
|---|---|---|---|
| 3,168,617 | 2/1965 | Richter | 439/492 |
| 3,319,217 | 5/1967 | Phillips | 439/825 |
| 3,601,755 | 8/1971 | Shiells, Jr. | 439/492 |
| 3,609,216 | 9/1981 | Copp | 174/113 R |
| 4,229,615 | 10/1980 | Orr, Jr. et al. | 174/117 |
| 4,358,180 | 11/1982 | Lincoln | 439/825 |
| 4,470,195 | 9/1984 | Lang | 29/825 |
| 4,556,265 | 12/1985 | Cunningham | 439/825 |
| 4,616,279 | 10/1986 | Poorman | 360/103 |
| 4,767,891 | 8/1988 | Biegon et al. | 174/34 |

Primary Examiner—Larry I. Schwartz
Assistant Examiner—Hien D. Vu
Attorney, Agent, or Firm—Bacon & Thomas

[57] ABSTRACT

A ribbon cable consisting of groups of individual strands of wire, the number of which when twisted together at each end, form a single stranded wire of a known gauge. These groups of wires are then laminated with insulating material, leaving the twisted ends of each end exposed a predetermined length. The results are a cable that is highly flexible because of the single stranding construction in the lamination area.

10 Claims, 1 Drawing Sheet

FLAT CABLE JUMPER

BACKGROUND OF THE INVENTION

1. Field of the Invention

The present invention relates to electrical cables and, in particular, to ribbon cable jumpers of the type used to connect printed circuit boards and other electrical devices.

2. Background of the Invention

Flat or ribbon cables are useful in a variety of applications in which multiple discrete signals must be carried on separate wires in a restricted space. The cables generally consist of a plurality of bare wires laminated between flexible insulating fabric or plastic layers. Such flexible cables are especially suitable as circuit board connectors or jumpers in computers and in telephone switching systems.

However, in conventional ribbon or flat cables, the flexibility of the cable is limited by the size of the individual wires in the cable. The thicker the wires, the greater the stiffness.

In certain applications, for example in the case of jumpers between a circuit board and the flying heads of a magnetic disk drive, it is essential that the stiffness of the jumper not interfere with the ability of the heads to maintain a constant spacing from the disk. In other applications, lack of flexibility may prevent the cable from bending sufficiently to fit into small spaces and tortuous paths. It has often proven impossible to use conventional ribbon cables in such applications.

An additional problem with prior ribbon cables has been the problem of termination. Conventionally, ribbon or flat cables have been connected to circuit boards by using separate specially adapted connectors. The thinner and more flexible the wires in the cable, the more difficult it is to terminate them with a connector. In order to connect the cable to the circuit board the connector must first be connected to the cable. Typically, the circuit boards to which the cables will be connected will have holes provided therein into which the connector can then be plugged.

While ribbon cable connectors generally work well for their intended purpose, the use of discrete connectors is disadvantageous in that it may significantly increase the cost and complexity of the above-mentioned systems. Even the simplest conventional ribbon cable connector requires at a minimum a terminal or pin for each of the wires in the cable, and means for connecting the pins or terminals to the individual wires through, or by removing, the insulation.

SUMMARY OF THE INVENTION

It is an object of the invention to provide a method of forming a flat or ribbon cable having increased flexibility in relation to the gauge of the wires at the ends of the cable.

It is a further object of the invention to provide a method of preparing a flat or ribbon cable so that it does not require a special connector in order to be attached to an electrical device or circuit board and yet has increased flexibility.

Finally, it is an object of the invention to provide a circuit board arrangement in which the circuit boards are connected by a cable jumper of increased flexibility without the use of special flat cable connectors.

These objects are accomplished in a preferred embodiment of the invention by twisting together exposed ends of groups of wires in the cable to form relatively thick wires for connection to an electrical device or circuit board.

The individual strands in the remainder of the cable, on the other hand, have a much smaller cross-section than the plugs, resulting in greatly increased flexibility while maintaining the connectability advantages of the thicker plugs.

DESCRIPTION OF THE PREFERRED EMBODIMENT OF THE INVENTION

Figure 1:
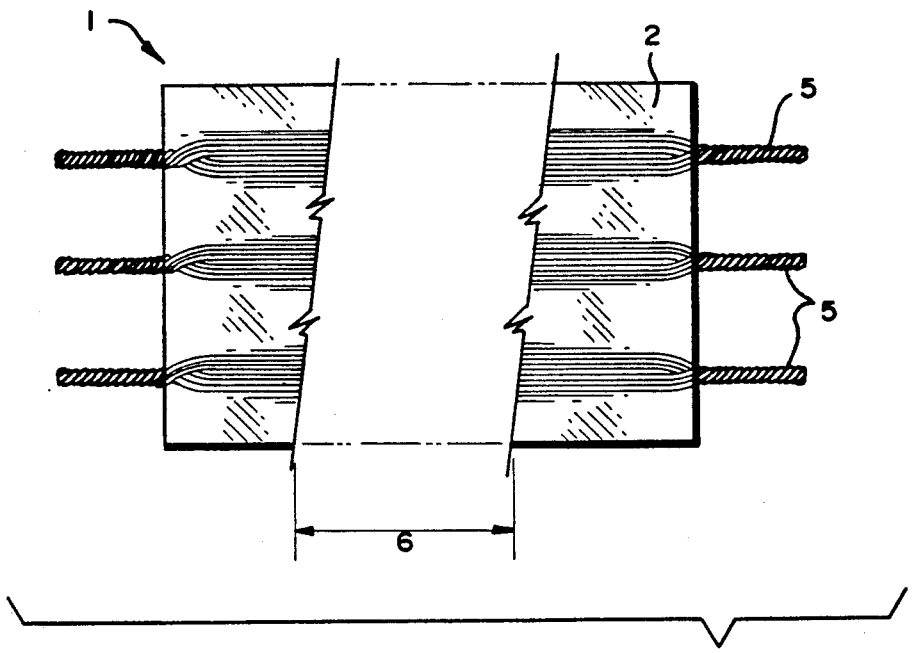
FIG. 1 is top view of a flat cable according to a preferred embodiment of the invention.
Figure 2:
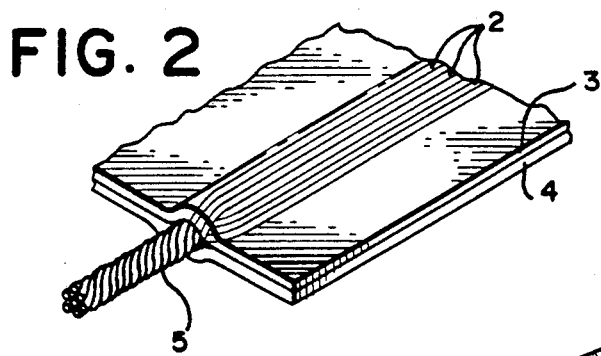
FIG. 2 shows, in perspective, the manner in which individual wires of the cable are prepared for termination.

FIGS. 1 and 2 show a ribbon or flat cable according to a preferred embodiment of the invention, including three groups of individual wires 2 encased in insulation layers 3 and 4. It will be appreciated by those skilled in the art that numerous different arrangements of wires in the cable and arrangements of the insulator are possible.

Figure 4:
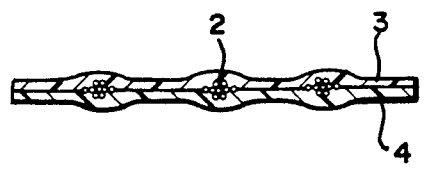
FIG. 4 shows a cross section of the insulated portion of the flat cable of the preferred embodiment.

The individual wires 2 of the cable may be of any number and diameter, which when twisted together may comprise a specific AWG gauge. 28 AWG 7/36 T/C or 26 AWG 7/34 T/C wires are typical of many electrical applications and are therefore used as an example. FIG. 4 shows a possible arrangement of the individual wire strands 2 within the insulated portion of the cable, although numerous other arrangements are also within the scope of the invention.

Suitable insulation for the cable of the preferred embodiment includes laminated layers of either polytetrafluoroethylene, i.e., Teflon ®, polyester, polyvinyl, or copolymers of these compounds. Other possible insulation materials are cloth, rubber, and additional types of plastic.

For the above-mentioned exemplary wire gauges, an insulation wall thickness of approximately 0.005 to 0.015 inches should provide adequate electrical insulation and flexibility for such typical applications as providing circuit board jumpers in a small computer.

Arrow 6 is included in FIG. 1 to indicate that the length of the cable is completely optional. For typical jumper applications, the length would typically be on the order of several inches, although longer and shorter cables are certainly within the scope of the invention. For purposes of impedance matching, it may be necessary to provide a specific length of cable which is dependent upon the frequency of the signals to be carried, as is well known in the art.

Each of the twisted groups of wires in the cable is intended to be attached to a single connector hole on a circuit board, or to any electrical device having a femaletype connector socket. In addition, the groups of wires may be directly attached to terminals other than holes, although it is believed that the greatest advantages will be obtained in the case of holes into which the groups can be plugged, as will be described below.

In the above-described cable, the distance between groups of individual wires is 0.1 inch, although this can of course be varied. For greatest efficiency, the groups may be spaced the same distance apart that corresponding jumper terminals or holes on the circuit board or other electrical device are spaced. On the other hand, it is also possible to evenly distribute the wires across the width of the cable so that no groups are formed, the wires being grouped upon formation into plugs as described below.

The insulation layers 3 and 4 do not extend all the way to the ends of the wires. Approximately 0.1 to 0.15 inches are left exposed in the preferred embodiment. The exposed wires are preferably twisted together to form plugs 5 according to the arrangement of groups.

For purposes of ensuring electrical contact upon connection to a circuit board or other connector, it is necessary that the wires 2 at the ends of the cable be bare enough not to interfere with the flow of electricity to an external contact, but it is within the scope of the invention to have the wires 2 be individually covered with insulation within the insulation layers 3 and 4. It is also possible to tin or solder the twisted groups of wires to hold them together.

As is apparent from FIG. 2, the twists or plugs 5 extend into the area covered by insulation. The insulation layers 3 and 4 are consequently separated at the ends where the plugs extend into the wire. This is especially advantageous because it provides greater mechanical stability for subsequent connections than would an arrangement in which untwisted wires were also exposed.

The arrangement as described above can be coupled to an electrical device or circuit board in exactly the same manner as a plug-type connector, i.e., the individual twisted-together groups of wires are plugged or inserted directly into holes of the device or circuit board as if they were solid plugs of a plug-type connector. As a result, the coupling of cable to the circuit board or female connector is greatly simplified.

Figure 3:
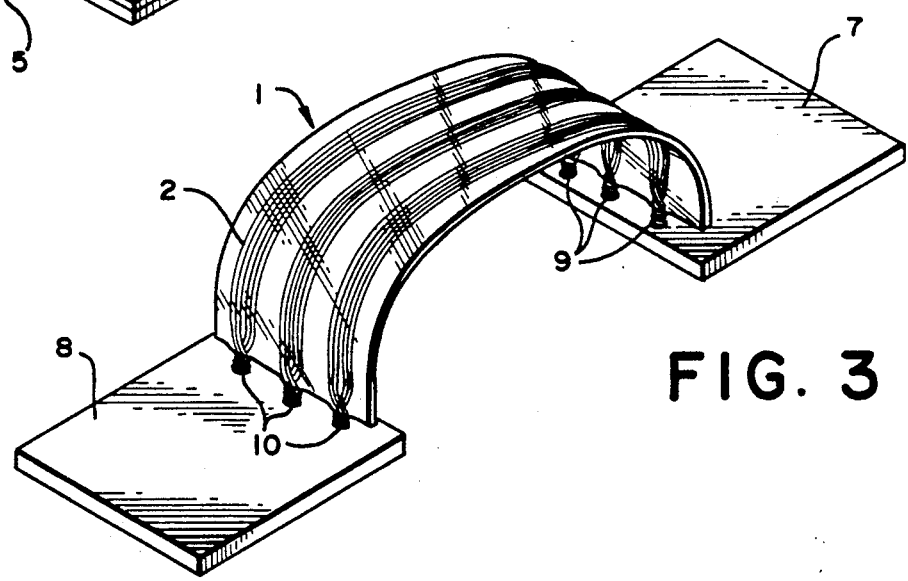
FIG. 3 depicts a circuit board arrangement using the flat cable shown in FIG. 2 as a flat cable jumper.

FIG. 3 shows such a coupling between circuit boards 7 and 8 having respective connection holes 9 and 10. As shown therein, plugs or twists 5 are inserted directly into the holes without the need for any additional connector.

After or during insertion, the twisted-together plugs may optionally be soldered to the holes or secured to the circuit board in any convenient manner, such as by clamping the cable to the device or circuit board.

While the method of assembly should be apparent from the foregoing description and accompanying drawings, it may be summarized as follows: individual groups of single strands of wire are laid on predetermined centers and twisted at each end of the individual stranded groups into a single wire of a predetermined gauge.

A jumper cable of a predetermined length is prepared by laminating the groups of individual wires of the cable so that the insulation is shorter than the individual wires, leaving exposed wires at the ends.

The individual groups or wires which are twisted together to form a single wire of twisted strands, may be inserted directly into the holes of a circuit board or other female-type connection socket without the need for a separate connector.

As noted above, it will be appreciated that numerous variations will occur to those skilled in the art, and that the invention should consequently be limited solely by the appended claims.

What is claimed is:

1. A method of preparing a flat cable for direct electrical connection to connection terminals of an electrical device, comprising the steps of providing a plurality of individual spaced-apart strands of wire; enclosing said individual strands of wire within an insulating material except at exposed ends of said strands; and twisting together said exposed ends of said strands to form plugs comprising groups of said twisted together strands, the portion of said wires surrounded by insulation remaining as individual spaced-apart strands of wire.

2. A method as claimed in claim 1, wherein said step of enclosing said individual strands of wire within an insulating material comprises the step of laminating said strands of wire between layers of insulating material except at said exposed ends of said strands.

3. A method as claimed in claim 1, wherein said terminals are holes and further comprising the step of directly inserting said plugs formed of said twisted together strands into said holes.

4. A method as claimed in claim 1, wherein said step of providing said plurality of individual spaced-apart strands of wire comprises the step of laying individual groups of single strands of wire on predetermined centers, and wherein said step of twisting together strands comprises the step of twisting ends of the individual groups of strands into plugs of a predetermined wire gauge.

5. A method as claimed in claim 1, wherein said step of twisting together strands to form a plug comprises the step of twisting said individual strands of wires such that the plug extends into said insulating material.

6. A flat cable, comprising:
a plurality of spaced-apart strands of wire individually surrounded by insulating material except at exposed ends of said strands, said individual strands and insulating material forming a flat cable, wherein said insulating material isolates said individual strands from each other; and wherein a group of said exposed portions of said individual strands form connection means comprising twistedtogether exposed ends of said strands for electrically connecting said wires with electrical connection terminals of an electrical device.

7. A flat cable as claimed in claim 6, wherein said insulating material includes portions of said insulating material laminated together to sandwich said wires.

8. A flat cable as claimed in claim 6, wherein said connection means partially extends into said insulating material.

9. A flat cable as claimed in claim 6, wherein said connection means form plugs of a specific wire gauge.

10. A flat cable as claimed in claim 6, wherein said individual strands of wires are arranged in at least two groups having two predetermined centers, and said plugs comprise twisted-together ends of said strands twisted respectively about the predetermined center of the group to which the twisted-together strand belongs.

* * * * *